United States Patent [19]

Remson

[11] Patent Number: 5,113,186

[45] Date of Patent: May 12, 1992

[54] APPARATUS FOR CONVERTING AN ALTERNATE MARK INVERSION SIGNAL TO UNIPOLAR SIGNALS WITH FREQUENCY DEPENDENT AMPLIFICATION

[75] Inventor: Joseph D. Remson, San Jose, Calif.

[73] Assignee: ROLM Systems, Santa Clara, Calif.

[21] Appl. No.: 635,051

[22] Filed: Dec. 28, 1990

[51] Int. Cl.⁵ .................................. H03M 5/18
[52] U.S. Cl. ........................... 341/68; 375/18; 307/268; 307/360; 341/57; 341/73
[58] Field of Search ............. 341/68, 69, 70, 71, 341/57, 72, 73, 58, 59; 375/17, 18, 19, 20, 76; 307/268, 360; 328/114, 164

[56] References Cited

U.S. PATENT DOCUMENTS

| 3,653,036 | 3/1972 | Whiting ................................. 341/57 |
| 4,123,625 | 10/1978 | Chow .................................... 375/18 X |
| 4,462,105 | 7/1984 | Wagner et al. ..................... 375/20 X |
| 4,860,009 | 8/1989 | LaRowe ............................... 341/73 |

Primary Examiner—Howard L. Williams

[57] ABSTRACT

The apparatus converts an AMI signal into three unipolar signals by selectively amplifying the AMI signals so that higher frequency components are amplified greater than lower components and then comparing the AMI signal with a positive and negative threshold to provide a first unipolar signal having information relating to positive levels of said AMI signal, a second unipolar signal having information relating to negative levels of said AMI signal and a Or gate for combining said first and second signals to provide a third signal having information related to both positive and negative levels.

17 Claims, 3 Drawing Sheets

APPARATUS FOR CONVERTING AN ALTERNATE MARK INVERSION SIGNAL TO UNIPOLAR SIGNALS WITH FREQUENCY DEPENDENT AMPLIFICATION

FIELD OF THE INVENTION

This invention relates to a digital signal converter and more particularly to a converter for converting an alternate mark inversion signal (AMI) into unipolar signal levels.

BACKGROUND OF THE INVENTION

As one can ascertain, there are numerous line codes that are specifically designed to not contain DC energy and thereby be unaffected by DC removal. One example of such a line code is bi-polar coding which solves the DC wander problem by using three levels to encode binary data. Specifically, a logic zero is encoded with zero voltage while a logic "1" is alternately encoded with positive and negative voltages. Hence the average voltage level is maintained at zero to eliminate DC components in the signal spectrum. Since bi-polar coding uses alternate polarity pulses for encoding logic "1's", it is also referred to as "alternate mark inversion" (AMI). A mark is a term arising from telegraphy to refer to the active or "1" state of a level encoded transmission line.

Bi-polar coding is the basic line coding procedure used in many telephone systems as, for example, by T1 lines in the telephone network. Essentially, rather than use full pulse periods, T1 lines use a 50% duty cycle pulse to encode each logic 1. 50% duty cycle pulses were selected to simplify timing recovery in the regenerative repeaters of a T1 line. A great deal of work has been done in regard to bi-polar codes. Because a bi-polar code uses alternating polarities for encoding "1's", strings of "1's" have strong timing components. However, a string of zeros contains no timing information and therefore must be precluded by the source. Alternate mark inversion systems are widely employed in a telephony. However, in most systems it is desirable to utilize or convert such a signal into signals suitable for operation with other types of logic structures. For example, a widely employed logic structure utilizes TTL technology (transistor-transistor logic). TTL integrated circuits have gained wide acceptance and have been used for many years. This family of integrated circuits reached broad popularity because of the compromise between speed and power. It is desirable to utilize such logic circuitry in telephone systems and other systems as well because the circuits are extremely reliable, have relatively low power consumption, and operate at high speeds with low propagation delay.

It is therefore an object of the present invention to provide an efficient and novel converter circuit which enables one to convert an AMI signal into unipolar output signals.

It is a further object of the present invention to convert an AMI signal into signals which can be employed with TTL logic circuits.

SUMMARY OF THE INVENTION

Apparatus for converting an AMI signal into a unipolar signal, comprising: amplifier means responsive to said AMI signal to selectively amplify said signal in a manner to increase the amplification of high frequency signal components compared to low frequency components of said AMI signal and comparator means responsive to said amplified AMI signal for comparing the same against a reference level to provide at an output at least one unipolar signal indicative of information content in said AMI signal.

DETAILED DESCRIPTION OF THE INVENTION

Referring to FIG. 1 there is shown the four waveforms depicting the various signals which are pertinent to this invention. Particularly FIG. 1A depicts a typical AMI signal. AMI encoding as indicated is a modulation technique used to transmit digital information in a serial format. The serial format is usually divided into frames. The frames are delineated by the use of any intentional code violation. That is, when any two successive logical "1's" are of the same polarity a modulation violation is noted. It is noted that in the signal shown in FIG. 1A there is such a violation indicated. It is, of course, understood that there are many more intentional violation codes that can be provided and implemented.

Figure 1A:
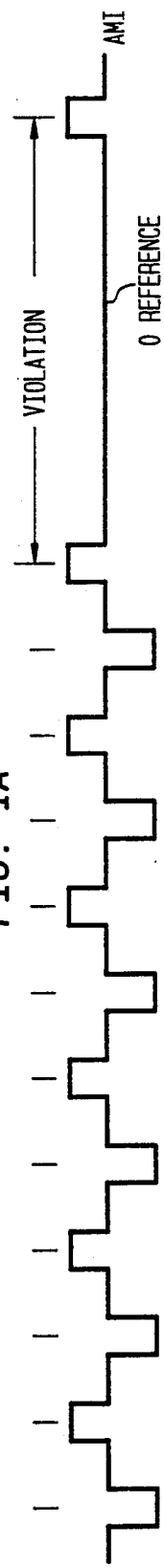
FIGS. 1A to 1D depict a series of waveforms useful in explaining the operation of this invention.
Figure 1B:

Referring to FIG. 1B there is shown a sample representation of the P_DATA which is derived from the AMI signal of FIG. 1A. As one can see, P_DATA is the information that is positive with respect to the zero reference level of the AMI signal. Thus P_DATA constitutes positive level information of the AMI signal.

Figure 1C:

FIG. 1C depicts N_DATA. N_DATA is the information that is below the zero reference signal or negative level information of the AMI signal.

Figure 1D:

FIG. 1D depicts R_DATA. It is seen that R_DATA is the ORed combination of P_DATA and N_DATA. Thus FIG. 1D depicts R_DATA which is essentially the ORed information of FIG. 1B and FIG. 1C. As above indicated, one can understand how the information content occurs due to the fact that logic zero is encoded with zero voltage while logic 1 is alternately encoded with positive and negative voltages. FIG. 1A shows an AMI signal having 12 "1's" followed by zeros and then a last "1" indicating a violation. As indicated, it is desirable to convert the signal shown in FIG. 1A to the signals of FIG. 1B, FIG. 1C and FIG. 1D. Hence it is an objective of the circuit to be described to transform the AMI signal of FIG. 1A into three unipolar output signals as, for example, the P_DATA signal of FIG. 1B, the N_DATA signal of FIG. 1C and the RP_DATA signal of FIG. 1D.

Figure 2:
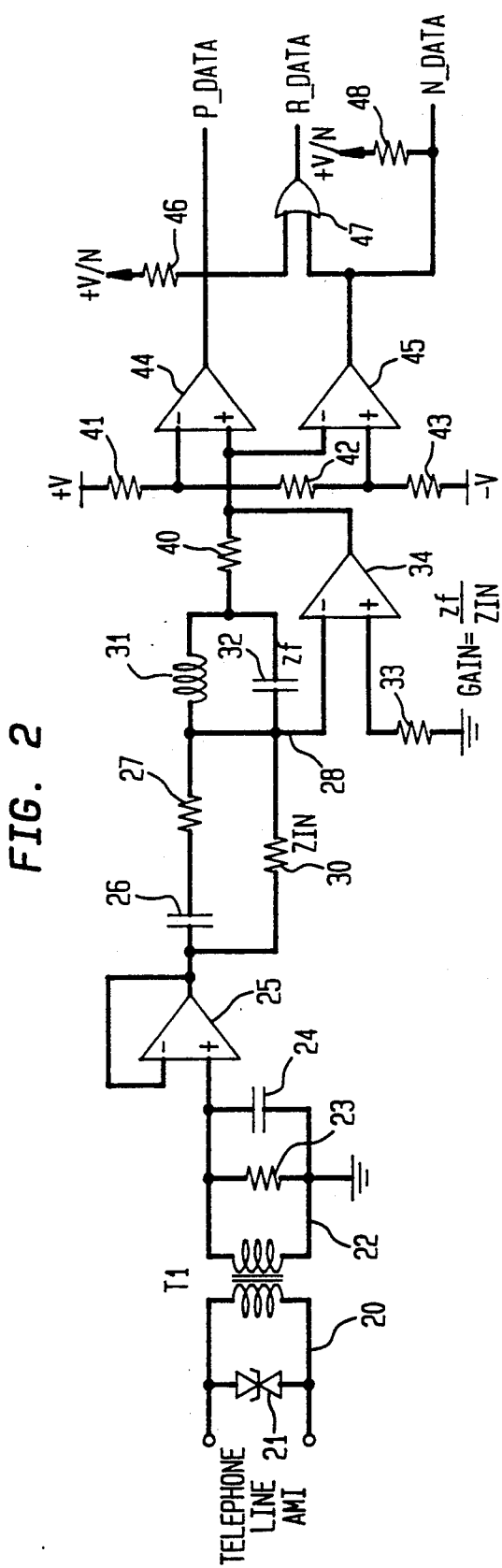
FIG. 2 is a schematic diagram depicting an AMI to unipolar converter circuit according to this invention.
Figure 3:
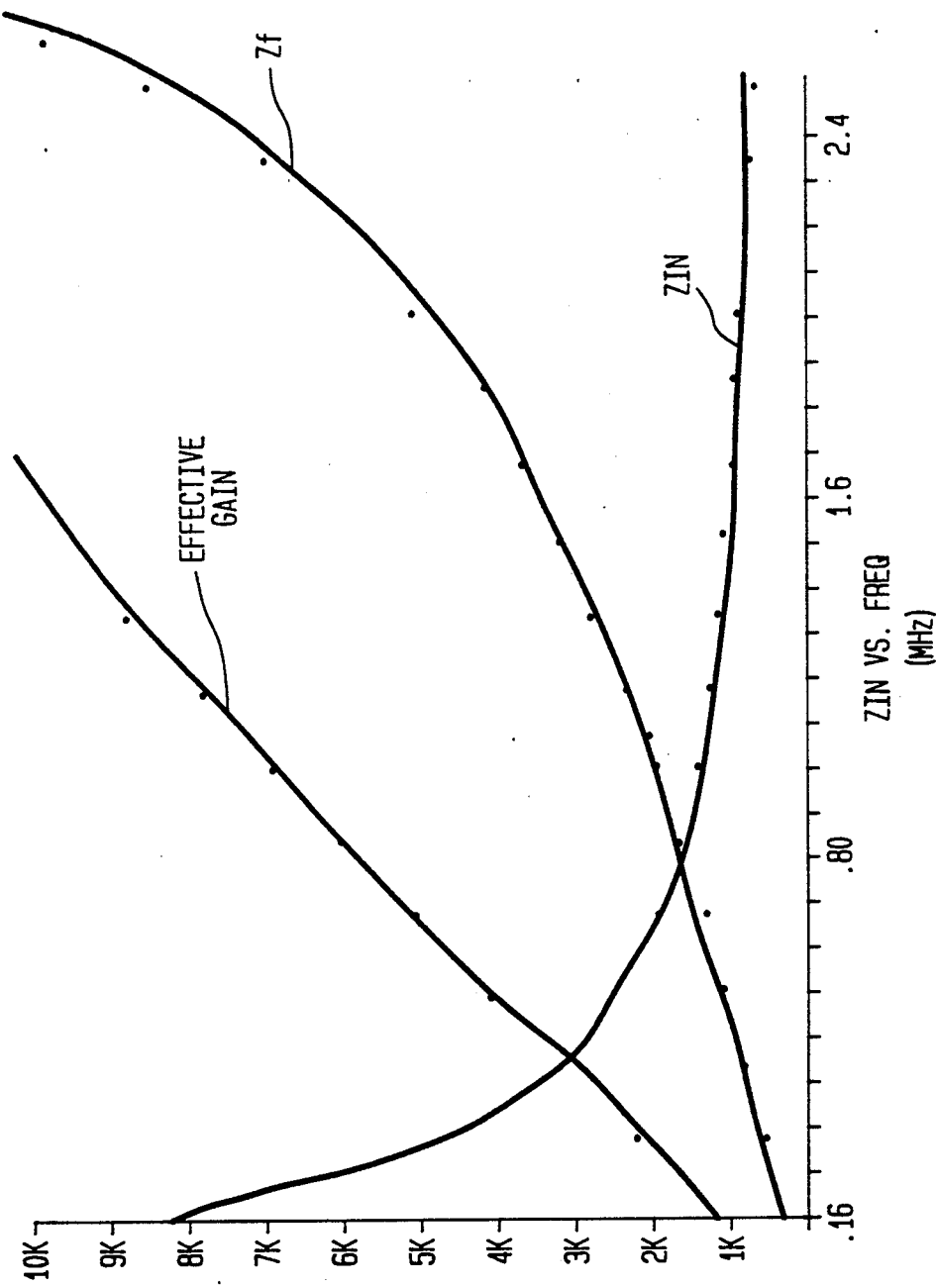
FIG. 3 is a graph depicting impedance versus frequency and useful in explaining the operation of this invention.

Referring to FIG. 2 there is shown a circuit diagram depicting an alternate mark inversion to unipolar converter according to this invention. As seen in FIG. 2, an AMI signal as present on a telephone line is applied to the primary winding 20 of a transformer T1. The primary winding 20 is conventionally protected by means of back to back Zener diodes or a diode network 21 to limit the magnitude of transients applied. Many protective devices are known and can be employed in lieu of network 21. The primary winding 20 is magnetically coupled to a secondary winding 22 which is shunted by means of a resistor 23 in shunt with a capacitor 24. Thus the AMI signal from the telephone line is isolated from the AMI converter to be described by means of the transformer T1. The back to back diode device 21 as indicated is a protective device to prevent incoming transients from damaging the electronic circuit on the other side of the transformer. The combination of resistor 23 in shunt with capacitor 24 is used for impedance matching. The secondary winding has one terminal coupled to reference potential and the other terminal coupled to the non-inverting input of an operational amplifier 25 arranged in a unity gain configuration. The operational amplifier 25 has its output coupled to the inverting terminal as is well known in the art. Essentially the operational amplifier 25 is arranged as a unity gain amplifier and used as an impedance transformer/buffer. Operational amplifiers are well known and many types can be employed for the circuit 25. The output of the unity gain amplifier 25 is directed to the inverting input terminal 28 of another operational amplifier 34 via a capacitor 26 in series with a resistor 27. The capacitor 26 and the resistor 27 appear in series and are shunted by means of a resistor 30. This network serves as the input impedance network ($Z_{in}$) for the amplifier 34. The network varies impedance with frequency as will be explained. The amplifier 34 has the non-inverting input returned to the point of reference potential via resistor 33. The output of amplifier 34 is coupled back to the input 28 through a feedback network which consists of resistor 40 in series with the parallel combination of inductor 31 and capacitor 32. The other terminal of inductor 31 and capacitor 32 is coupled to terminal 28 which, as indicated above, is the inverting input of amplifier 34. Essentially the amplifier 34 possesses a gain characteristic as shown in FIG. 3. FIG. 3 shows a plot of the input impedance of the amplifier versus frequency. As one can ascertain from FIG. 2, the inductance 31 in shunt with capacitor 32 forms an LC circuit which has a particular resonance. The point of resonance is selected to be significantly higher than the effective input frequency of the AMI signal. Essentially, for a given gain bandwidth function the point of resonance would be selected to be much higher than this gain-band width factor. The amplifier 34 operates to compensate for the deterioration of the higher frequency components of the AMI signal due to transmission line losses and so on. Basically, resistor 30, resistor 27, and capacitor 26 form the input impedance circuit to the amplifier 34. The resistor 40, inductor 31, and capacitor 32 form the feedback path. Hence as is well known, the gain of an operational amplifier such as 34, follows the general equation. This gain is equal to the feedback impedance ($Z_f$) divided by the input impedance ($Z_{in}$) or Gain = $Z_f / Z_{in}$. This is shown in FIG. 3 where appropriate curves depict the input impedance $Z_{in}$, the feedback impedance $Z_f$ and the gain. Thus the effective gain curve is as shown in FIG. 3. The operation of the circuit is as follows.

The impedance $Z_f$ of the tank circuit which essentially consists of inductor 31 and capacitor 32 increases as the frequency increases towards resonance but the value of the tank circuit is selected so that it does not reach resonance. The impedance $Z_{in}$ of the input circuit decreases as the input frequency increases based on the gain factor of the amplifier. Thus there is a marked increase in gain for the higher frequency components of the AMI signal. The output of the amplifier stage 34 is also directed to the non-inverting input of a first comparator 44 and to the inverting input of a second comparator 45. Comparator 44 and comparator 45 are operational amplifiers or comparators which receive a reference bias level from a voltage divider consisting of resistors 41, 42, and 43 and coupled between a positive voltage source designated as +V and a negative voltage source designated −V. The value of the +V and −V sources can be ±12 volts. The resistors are selected so that there is a fixed negative voltage applied to the non-inverting input of comparator 45 and an equal fixed positive voltage applied to the inverting input of comparator 44. The resistors 41, 42, and 43 are selected so that 41 may be equal to 10K, 42 equal to 4K, and 43 also equal to 10K. In this manner the stages form a bi-polar to unipolar demodulator. The voltage levels at the inverting and non-inverting inputs of devices 44 and 45 respectively are selected to accommodate the noisy situation in which the system is specified to operate in. The output of amplifier 34 is coupled respectively to the non-inverting input of amplifier 44 and to the inverting input of amplifier 45. Therefore when the magnitude of the voltage applied to the non-inverting input of amplifier 44 exceeds the voltage at the inverting input, the output of amplifier 44 will rise to a TTL logical 1 level. Similarly, when the magnitude of the voltage applied to the inverting input of amplifier 45 exceeds the voltage at the non-inverting input of the amplifier, the output of the amplifier will rise to a TTL logical 1 level. The outputs remain at the logical 1 levels as long as the input voltage exceeds the respective magnitudes. The output of comparator 44 is referenced to a voltage level via resistor 46 as is the output of comparator 45 referenced to the same voltage level designated as +V/N via resistor 48. Thus the output of amplifier 44 produces P_DATA as shown in FIG. 1B. The output of amplifier 45 provides N_DATA as shown in FIG. 1C. The OR gate 47 receives the output from amplifiers 44 and 45 to produce the ORed output designated as R_DATA and shown in FIG. 1D. Thus as one can understand, the above-noted signals can be conveniently used to determine modulation violations as well as further processing by the system using TTL logic. It is indicated that the above-described technique offers great advantages in that it is totally responsive to AMI signals of all variations based on the fact that the high frequency components of the signal are operated on with a greater gain than the low frequency components. This operation insures that there is always a proper signal level to enable one to properly convert the AMI signal into the unipolar signals as described above.

I claim:

1. Apparatus for converting an AMI signal into a unipolar signal, comprising:
   an amplifier having an input and output terminal, a first frequency selective circuit providing a feedback impedance coupled between said input and output terminal for providing an increasing impedance with frequency,
   a second frequency selective circuit providing a input impedance coupled to said input to provide a decreasing impedance with frequency, with the gain of said amplifier proportional to the feedback impedance divided by the input impedance whereby said high frequency signal components of said AMI signal are amplified by greater factors for increasing higher frequencies at said amplifier output terminal, and comparator means responsive to said amplified AMI signal for comparing the same against a reference level to provide at an output at least one unipolar signal indicative of information content in said AMI signal.

2. The apparatus according to claim 1, wherein said first frequency selective circuit is a tuned circuit including a capacitor in shunt with an inductance.

3. The apparatus according to claim 1, wherein said second frequency selective circuit includes a capacitor in series with a resistor.

4. The apparatus according to claim 1, wherein said comparator means includes a first comparator operating with a positive reference level to provide at an output a first unipolar signal containing information indicative of positive AMI levels (P_DATA), a second comparator operating with a negative reference level to provide at an output a second unipolar signal containing information indicative of negative AMI levels (N_DATA).

5. The apparatus according to claim 4 including means for combining said first and second signals to provide a third unipolar signal containing information indicative of both positive and negative AMI levels (R_DATA).

6. The apparatus according to claim 1, wherein said amplifier is a high gain operational amplifier.

7. The apparatus according to claim 1, further including:
a transformer having a primary winding and a secondary winding,
means for applying an AMI signal to said primary winding to generate an AMI signal at said secondary winding,
a unity gain amplifier having an input coupled to said secondary winding and an output for providing said AMI signal to said amplifier.

8. The apparatus according to claim 1, further including:
a transformer having a primary winding and a secondary winding,
means for applying an AMI signal to said primary winding to generate an AMI signal at said secondary winding and,
a capacitor in shunt with a resistor and coupled across said secondary winding to provide impedance matching.

9. The apparatus according to claim 4, wherein said means for combining is an OR gate having a first input responsive to said first unipolar signal of said first comparator and a second input responsive to said second unipolar signal of said second comparator.

10. The apparatus according to claim 9, wherein said AMI signal is received via a telephone line.

11. The apparatus according to claim 4, wherein said first, second and third unipolar signals are TTL compatible.

12. Apparatus for converting an AMI signal into three unipolar signals comprising:
an amplifier having an input adapted to receive said AMI signal and an output for providing an amplified AMI signal, with said input having a first circuit exhibiting a decrease in impedance with an increase in frequency and operating as an input impedance for said amplifier,
a second circuit coupled between the input and output of said amplifier and exhibiting an increase in impedance with an increase in frequency to provide said amplifier with a gain that increases rapidly as frequency increases to cause high frequency components of said AMI signal to be amplified by greater factors than lower frequency components,
first and second comparators having one input coupled to said amplifier output for receiving said AMI signal, with a second input of said first comparator coupled to a point of positive reference potential to cause said first comparator to provide a first unipolar signal indicative of positive AMI levels when said AMI signal level exceeds said positive reference potential, with a second input of said second comparator coupled to a point of negative reference potential to cause said second comparator to provide a second unipolar signal indicative of negative AMI levels when said AMI signal exceeds said negative reference potential, and
means for combining said first and second unipolar signals to provide a third unipolar signal indicative of both positive and negative AMI level information.

13. The apparatus according to claim 12 further including a buffer amplifier having an input for receiving an AMI signal and having an output for applying said AMI signal to said input of said amplifier.

14. The apparatus according to claim 12, wherein said first circuit includes a resistor in series with a capacitor.

15. The apparatus according to claim 12, wherein said second circuit includes an inductor in shunt with a capacitor.

16. The apparatus according to claim 12, wherein said amplifier is an operational amplifier.

17. The apparatus according to claim 12, wherein said first and second comparators include operational amplifiers.

* * * * *